United States Patent
Huynh et al.

(10) Patent No.: US 10,410,828 B2
(45) Date of Patent: Sep. 10, 2019

(54) CHARGED PARTICLE BEAM SYSTEM AND METHODS

(71) Applicant: Carl Zeiss Microscopy, LLC, Thornwood, NY (US)

(72) Inventors: Chuong Huynh, Quincy, MA (US); Bernhard Goetze, Cambridge, MA (US); John A. Notte, IV, Gloucester, MA (US); Diane Stewart, Ipswich, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 308 days.

(21) Appl. No.: 14/976,162

(22) Filed: Dec. 21, 2015

(65) Prior Publication Data

US 2016/0203948 A1    Jul. 14, 2016

Related U.S. Application Data

(60) Provisional application No. 62/095,390, filed on Dec. 22, 2014.

(51) Int. Cl.
*H01J 37/304*    (2006.01)
*H01J 37/20*    (2006.01)
(Continued)

(52) U.S. Cl.
CPC ............ *H01J 37/304* (2013.01); *H01J 37/20* (2013.01); *H01J 37/228* (2013.01);
(Continued)

(58) Field of Classification Search
CPC ........ H01J 37/20; H01J 37/228; H01J 37/244; H01J 37/304; H01J 37/3171;
(Continued)

(56) References Cited

U.S. PATENT DOCUMENTS

| 4,897,552 | A | * | 1/1990 | Okunuki | ............... | B82Y 10/00 |
| | | | | | | 250/396 R |
| 5,411,937 | A | * | 5/1995 | Wendt | .................. | B82Y 10/00 |
| | | | | | | 216/3 |

(Continued)

FOREIGN PATENT DOCUMENTS

| CN | 103718268 A | 4/2014 |
| CN | 104089966 A | 10/2014 |

(Continued)

OTHER PUBLICATIONS

Cybart et al, "Nano Josephson Superconducting Tunnel Junctions in Y—Ba—Cu—O Direct-Patterned with a Focused Helium Ion Beam", 2015.*

(Continued)

*Primary Examiner* — David E Smith
(74) *Attorney, Agent, or Firm* — Fish & Richardson P.C.

(57) ABSTRACT

Disclosed is a charged particle beam system comprising a charged particle beam column having a charged particle source forming a charged particle beam, an objective lens and a first deflection system for changing a position of impingement of the charged particle beam in a sample plane. The system further comprises a sample chamber comprising a sample stage for holding a sample to be processed, and a controller configured to create and store a height map of a sample surface. The controller is further configured to dynamically adjust the objective lens of the charged particle beam in dependence on a position of impingement of the charged particle beam according to the height map.

22 Claims, 10 Drawing Sheets

(51) Int. Cl.
*H01J 37/22* (2006.01)
*H01J 37/244* (2006.01)
*H01J 37/305* (2006.01)
*H01L 39/24* (2006.01)

(52) U.S. Cl.
CPC ........ *H01J 37/244* (2013.01); *H01J 37/3056* (2013.01); *H01L 39/249* (2013.01); *H01L 39/2496* (2013.01); *H01J 2237/216* (2013.01); *H01J 2237/30472* (2013.01)

(58) Field of Classification Search
CPC ............. H01J 37/3174; H01J 2237/216; H01J 2237/3056; H01J 2237/30472; H01L 39/249; H01L 39/2496
See application file for complete search history.

(56) References Cited

U.S. PATENT DOCUMENTS

| | | | |
|---|---|---|---|
| 5,736,281 A * | 4/1998 | Watson | B82Y 10/00 430/296 |
| 7,786,451 B2 | 8/2010 | Ward et al. | |
| 8,227,752 B1 * | 7/2012 | Mantz | H01J 37/28 250/306 |
| 8,247,785 B2 | 8/2012 | Zeile et al. | |
| 8,759,760 B2 | 6/2014 | Zeidler et al. | |
| 2001/0048083 A1 * | 12/2001 | Hagiwara | G03F 7/70025 250/492.22 |
| 2002/0014407 A1 * | 2/2002 | Allen | H01J 37/317 204/298.36 |
| 2002/0017619 A1 * | 2/2002 | Hirose | H01J 37/3005 250/492.3 |
| 2003/0001109 A1 * | 1/2003 | Morio | H01J 37/3045 250/492.21 |
| 2004/0077504 A1 * | 4/2004 | Adachi | H01L 39/225 505/234 |
| 2004/0099819 A1 * | 5/2004 | Yamaguchi | G01B 11/00 250/492.22 |
| 2004/0140438 A1 * | 7/2004 | Gerlach | B82Y 10/00 250/492.21 |
| 2004/0188611 A1 * | 9/2004 | Takeuchi | H01J 37/21 250/310 |
| 2005/0145791 A1 * | 7/2005 | Fujita | G01N 23/225 250/311 |
| 2006/0169899 A1 | 8/2006 | Parker et al. | |
| 2010/0001203 A1 * | 1/2010 | Nakayama | B82Y 10/00 250/397 |
| 2010/0207017 A1 * | 8/2010 | Horiuchi | B82Y 10/00 250/252.1 |
| 2012/0261573 A1 | 10/2012 | Adamec | |
| 2012/0286160 A1 * | 11/2012 | Ohashi | H01J 37/28 250/310 |
| 2013/0161511 A1 * | 6/2013 | Karimata | H01J 37/261 250/307 |
| 2013/0277756 A1 * | 10/2013 | Kawano | H01L 23/544 257/384 |
| 2014/0175279 A1 * | 6/2014 | Agemura | H01J 37/244 250/310 |
| 2014/0197310 A1 * | 7/2014 | Hill | G01N 23/2254 250/307 |
| 2014/0291512 A1 * | 10/2014 | Nakatani | G01N 23/2258 250/307 |
| 2015/0136978 A1 * | 5/2015 | Mihira | H01J 37/304 250/307 |
| 2015/0255250 A1 * | 9/2015 | Sato | G01N 1/286 250/307 |

FOREIGN PATENT DOCUMENTS

| | | |
|---|---|---|
| JP | 2008-251557 A | 10/2008 |
| JP | 2010-016170 A | 1/2010 |
| JP | 2010-192538 A | 9/2010 |
| JP | 2014-082028 A | 5/2014 |
| JP | 2014-182984 A | 9/2014 |
| TW | 201241864 | 10/2012 |

OTHER PUBLICATIONS

Shane A. Cybart et. al Nano Josephson superconducting tunnel junctions in Y-Ba-Cu-O direct-patterned with a focused helium ion beam.
Chinese Office Action and Search Report, with translation thereof, for corresponding CN Appl No. 201511036232.3, dated Sep. 5, 2018.
Taiwanese Office Action, with translation thereof, for corresponding TW Appl No. 104142911, dated May 10, 2019.
Chinese Office Action, with translation thereof, for corresponding CN Appl No. 201511036232.3, dated Apr. 23, 2019.
Japanese Office Action, with summary, for corresponding JP Appl No. 2015-248925, dated Jul. 2, 2019.

* cited by examiner

CHARGED PARTICLE BEAM SYSTEM AND METHODS

CROSS-REFERENCE TO RELATED APPLICATION

This application claims priority under 35 U.S.C. § 119(e)(1) to U.S. Application Ser. No. 62/095,390, filed on Dec. 22, 2014, the entire contents of which are incorporated by reference herein.

FIELD

The disclosure relates to charged particle beam systems and methods. More particular, the disclosure relates to a charged particle beam system that can be used for creating Josephson junctions made of a high temperature superconducting material. In addition, the present disclosure relates to methods for creating Josephson junctions in a high temperature superconducting material by charged particle beam irradiation.

BACKGROUND

Charged particle beam systems in the form of gas field ion beam systems are disclosed for example in U.S. Pat. No. 7,786,451. A combination of an electron beam system with an optical microscope for example is disclosed in U.S. Pat. No. 8,759,760 B2. Furthermore, a combination of an electron microscope with a focused ion beam column for example is disclosed in U.S. Pat. No. 8,247,785 B.

Very recently an internet publication by Shane A. Cybart et. al "Nano Josephson superconducting tunnel junctions in Y—Ba—Cu—O direct-patterned with a focused helium ion beam" has been published. In this publication based on a co-authorship of one of the inventors of the present patent application, the creation of localized Josephson superconducting tunnel junctions created in a high superconducting material YBCO ($YAa_2Cu_3O_{7-\delta}$) by using a 500 pm diameter focused beam of helium ions to direct write tunnel barriers has been described.

The object of the present disclosure is to provide improved methods for creating Josephson superconducting tunnel junctions in a high temperature superconductor material. A further object of the present disclosure is to provide an improved charged particle beam system for creating such or similar superconducting tunnel junctions.

SUMMARY

According to a first aspect the disclosure features a charged particle beam system including a charged particle beam column having a charged particle source forming a charged particle beam, an objective lens, and a first deflection system for changing a position of impingement of the charged particle beam in a sample plane. The charged particle beam system further includes a sample chamber including a sample stage for holding a sample to be processed, and a controller configured to create and store a height map of a sample surface. The controller is further configured to dynamically adjust the objective lens of the charged particle beam system in dependence on a position of impingement of the charged particle beam according to the height map.

Based on the data in the height map the focusing of the charged particle beam can be optimized and adjusted for each position on the sample to be processed by the charged particle beam.

In an embodiment the controller is further configured to receive design data of the sample surface and the controller is further configured to control the first deflection system based on a combination of the design data with data recorded during or after loading the sample to the sample chamber. Based on a comparison of positions of alignment marks according to the design data with positions of alignment marks identified in the recorded image an alignment of the sample with respect to an optical axis of the charged particle beam system can be performed.

The charged particle beam column can be an ion beam column including an ion source for forming an ion beam, and the charged particle beam system can further include an electron optical column having an electron source for forming an electron beam. The electron beam or the ion beam can be used for a fine alignment step between the sample and the optical axis of the ion beam column. In addition either the electron beam or the ion beam can be used to record the height map.

The controller can be further configured to adjust the position of impingement of the charged particle beam in dependence on positions identified in an image recorded with the electron beam or the ion beam.

The sample stage can provide a movability of a sample positioned on the sample stage in at least three linear independent directions, and the sample stage can include a measuring system for measuring a movement of the sample stage. The measuring system can provide a measuring accuracy of 5 nm or less. The measuring system can include interferometric measuring systems. In addition, the measuring system can provide an interferometric measuring system for movements of the sample perpendicular to the direction of an optical axis of the charged particle beam system as well as an interferometric measuring system for measuring a movement of the sample along the direction of the optical axis of the charged particle beam system.

The charged particle beam system further can include an optical image recording system for recording an image of the sample surface, and the controller can be configured to receive an image recorded with the optical image recording system. Based on a comparison of positions of alignment marks according to the design data with positions of alignment marks identified in the recorded optical image, a rough alignment of the sample with respect to an optical axis of the charged particle beam system can be performed.

The charged particle beam can include ions.

The charged particle beam system can additionally include a stigmator, and the controller can be further configured to adjust the stigmator based on an image recorded by scanning a portion of the sample surface with the charged particle beam and detection of interaction products caused to leave the sample surface while scanning. Recording of an image of a defined and known structure can be used to realign and recalibrate the charged particle beam system during a long processing time by repeatedly recording images of the defined structure and evaluating such recorded images.

The charged particle beam system can include a second deflection system, and the controller can be further configured to adjust the second deflection system based on an image recorded by scanning a portion of the sample surface with the charged particle beam and detection of interaction products caused to leave the sample surface while scanning. Recording of an image of a defined and known structure can be used to realign and recalibrate the charged particle beam system during a long processing time by repeatedly recording images of the defined structure and evaluating such recorded images.

The controller can be further configured to control a dose of charged particles impinging on the sample region to be processed based on interaction products leaving the sample during processing of the sample region.

Another embodiment features a charged particle beam system including a charged particle beam column having a charged particle source forming a charged particle beam, an objective lens, a stigmator and a first deflection system for changing a position of impingement of the charged particle beam in a sample plane. The charged particle beam system in addition includes a sample chamber including a sample stage for holding a sample to be processed, a detector for detecting interaction products caused to leave the sample during impingement of the charged particle beam onto the sample surface, and a controller configured to generate image data based on output signals of the detector. The controller can be further configured to adjust the stigmator based on an image recorded by scanning a portion of the sample surface with the charged particle beam and detection of interaction products caused to leave the sample surface while scanning.

Another embodiment features a charged particle beam system including a charged particle beam column having a charged particle source forming a gas field ion beam, an objective lens, and a first deflection system for changing a position of impingement of the charged particle beam in a sample plane. The charged particle beam system can further include a sample chamber including a sample stage for holding a sample to be processed, a detector for detecting interaction products caused to leave the sample during impingement of the charged particle beam onto the sample surface, and a controller configured to generate image data based on output signals of the detector. The controller can be further configured to control a dose of charged particles impinging on a sample region to be processed based on interaction products leaving the sample during processing of the sample.

According to another aspect, the disclosure features a method of processing a sample including the steps:
a. loading a sample into the sample chamber of a charged particle beam system,
b. generating an image of a surface of the sample using a light optical imaging system or an electron beam system,
c. identifying reference marks in the image,
d. determining positions of the reference marks on the surface of the sample based on the identified reference marks,
e. determining a location of a first region to be processed based on the positions of the reference marks and design data of the sample,
f. biasing a deflection system of the charged particle beam system according to the location determined in step e, and
g. impinging the charged particle beam to the first region.

In embodiments the sample can include a film of a superconducting material at least partially covered by an electrically conductive layer and including at least one first region in which the superconducting film is not covered by the electrically conductive layer.

Based on a comparison of positions of alignment marks according to the design data with positions of alignment marks identified in the recorded light optical image a rough alignment of the sample with respect to an optical axis of the charged particle beam system can be performed.

The method can further include the step of recording a height map of the sample surface. Based on the data in the height map the focusing of the charged particle beam can be optimized and adjusted for each position on the sample to be processed by the impingement of the charged particle beam. Accordingly the method can further include a step of adjusting a focus position of the charged particle beam in step g based on the height map.

The height map can be recorded by using an electron beam or a gas field ion beam.

The method can further include a step of measuring a number of interaction products of the charged particle beam with the sample while the charged particle beam impinges on the first region, and dynamically adjusting a dwell time during which the charged particle beam impinges on the first region based on the measured number of interaction products by comparing the measured number of interaction products with a predefined number of interaction products. In this way the dose of charged particles impinging on a particular sample region can be controlled by detecting the interaction products. Alternatively the dose of charged particles impinging on a particular sample region can be determined by measuring the current in the charged particle beam in a preceding current measuring step in which, for example, the charged particle beam is deflected into a Faraday cup and the current between the Faraday cup and electric ground is measured. By multiplying the measured current with the applied dwell time and dividing this product by the spot area of the charged particle beam on the surface of the sample a value for the ion dose can be determined. To the extent that during processing of the sample at a particular region the charged particle beam is scanned across the sample surface because the area of the region to be processed is larger than the spot area of the charged particle beam on the surface of the sample, the step width applied in this scanning can also be considered when determining the charged particle dose based on the current of the charged particle beam. This is in particular appropriate if the applied step width is smaller than the diameter of the charged particle beam on the surface of the sample.

The method can further include a step of focusing the charged particle beam with an objective lens to generate a focused charged particle beam spot at a first distance from the objective lens, and positioning the sample relative to the charged particle beam so that the superconducting film has a second distance from the objective lens, wherein the first distance is larger or smaller than the second distance. By a controlled slight defocus of the charged particle beam an intensity profile of the charged particle beam can be adjusted to have a steep increase and decrease at borders of the beam. This especially applies for cases in which for processing the sample a gas field ion beam is used for the charged particle beam. Because of the small cone angle which a gas field ion beam can have in a slightly defocused status the diameter of the ion beam does not change considerably through the sample to be processed, i.e. along the thickness of the film of high temperature superconducting material. The first distance can be at least 1 µm larger or smaller than the second distance. The first distance also can be at most 100 µm larger or smaller than the second distance. Especially the first distance can be between 1 µm and 100 µm larger or smaller, preferably between 10 µm and 100 µm larger or smaller than the second distance.

In an embodiment the ion optical column can include a beam liming aperture, and the method can further include adjusting the objective lens to project the beam limiting aperture onto the surface of the sample. Projecting a beam limiting aperture onto the sample surface can provide an ion beam intensity profile on the sample surface having a top-hat form.

The method also can provide a step of biasing the sample with a voltage which is negative or positive with respect to a voltage of the objective lens. A negative voltage bias applied to the sample increases the landing energy of ions when impinging on the sample surface. In this manner films of high temperature superconductor material having an increased thickness can be processed.

The method can also further include a step of repeatedly biasing the deflection system of the charged particle beam system according to the location determined in a preceding step and impinging the charged particle beam to the first region for a first number of first regions without moving the sample relative to the ion beam column. In this manner a plurality of first regions can be processed by solely using the deflection range within which the charged particle beam can be deflected by the first beam deflection system.

The method can further include a step of moving the sample relative to the charged particle beam column and repeatedly biasing a deflection system of the charged particle beam system according to the location determined in a preceding step and impinging the charged particle beam to the first region for a second number of first regions. In this manner a large sample including a plurality of locations to be processed can be processed. The method can further include a step of measuring a movement of the sample stage relative to the charged particle beam column.

The charged particle beam can be an ion beam, and the method can further include a step of writing a system alignment mark into the sample by ion beam sputtering or ion beam induced gas chemical deposition and periodically recording an image of the mark. By evaluating images of the system alignment mark the system parameters can be realigned and recalibrated to reduce any effect of long term drifts. The method accordingly also can further include a step of adjusting parameters of the charged particle beam system based on the recorded image of the system alignment mark.

A further embodiment features a method of creating a Josephson junction including the steps of providing a sample including a film of a superconducting material at least partially covered by an electrically conductive layer and including at least one first region in which the superconducting film is not covered by the electrically conductive layer, and impinging an ion beam to the first region.

In an embodiment the ion beam impinges on the sample with an ion current of at most 100 pico ampere for a dwell time of at most 1 ms.

In an further embodiment the method further includes detecting interaction products caused to leave the sample during impingement of the ion beam due to the ion beam impinging on the sample, and repeating the step of impingement of the ion beam for a number of times or for a duration based on a number of detected interaction products.

While performing the method an average energy of the ions in the ion beam can be in a range between 10 keV and 100 keV.

The method can further include the steps of providing an ion optical column having an objective lens, focusing the ion beam with the objective lens to generate a focused ion beam spot at a first distance from the objective lens, and positioning the sample relative to the ion beam so that the superconducting film has a second distance from the objective lens, wherein the first distance is larger or smaller than the second distance.

In a particular embodiment the first distance is at least 10 µm larger or smaller than the second distance. In a further particular embodiment the first distance is at most 100 µm larger or smaller than the second distance. In particular the first distance can be between 10 nm and 100 nm larger or smaller than the second distance.

Providing a controlled defocus of the ion beam during processing of the sample can result in a favorable ion intensity profile of the ion beam when impinging on the sample. In particular the intensity profile can have steeper increases and decreases of the beam intensity at the border of the beam compared to a Gaussian intensity profile. Beam induced dislocations can thereby be created more homogeneously within a predicted area.

In a further particular embodiment the ion optical column includes a beam limiting aperture, and the method further includes adjusting the objective lens to project the beam limiting aperture onto the film.

In a further embodiment during processing of the sample by impingement of the ion beam the method can includes the further step of biasing the sample with a voltage which is negative or positive with respect to a voltage of the objective lens. A negative sample bias causes a post acceleration and increase of the average energy of the ions in the ion beam between the objective lens of the charged particle beam column and the sample. Due to the increased average beam energy the ions can penetrate deeper into the sample. Thereby beam induced dislocations can be created in a thicker sample compared to the case with a lower average ion beam energy.

In a further embodiment the sample can include reference marks at predefined locations relative to the first region and, the method can include the further step of scanning a second region of the sample including the reference marks but not including the first region by an ion beam or an electron beam, detecting interaction products caused to leave the sample due to the impinging ion beam or the impinging electron beam while scanning the second region, determining positions of the reference marks based on the detected interaction products, determining a position of the first region based on the positions of the reference marks, applying a voltage to a deflection system in the ion beam column to deflect the ion beam to the first region, and impinging the ion beam onto the sample in the first region to process the sample in the first region.

In a further embodiment the step of impinging the ion beam to the first region can be repeated for a first number of different first regions without moving the sample relative to the ion beam column. In this way a plurality of Josephson junctions can be created at different locations on the sample by only using the range in which the ion beam can be deflected by the first deflection system without moving the sample.

In a still further embodiment the method can include a step of moving the sample relative to the ion beam column and, thereafter repeating the step of impinging ions to the first region for processing the first region for a second number of first regions. In this way a plurality of Josephson junctions can be created at different locations on a very large sample.

In a further embodiment the ion beam column is a part of an ion beam microscope having a sample stage and the sample stage includes at least one measuring system for measuring a movement of the sample stage relative to the ion beam column.

In a still further embodiment the method can include a step of writing a system alignment mark into the sample by ion beam sputtering or ion beam induced gas chemical deposition, and periodically recording an image of the mark. By evaluating the periodically recorded image of the system, alignment mark data for realigning and/or recalibrating the system can be generated. In this manner a long term stability of the process needed for creating a plurality of Josephson junctions can be achieved. In an embodiment the method can further include adjusting parameters of the charged particle beam system based on the recorded image of the system alignment mark.

In a further embodiment the disclosure features a method of manufacturing a Josephson junction including the steps of providing a sample including a film of a superconducting material at least partially covered by an electrically conductive layer and including at least one first region of the superconducting film not covered by the electrically conductive layer, and impinging an ion beam of ions to the first region during a dwell time of at least 100 nanoseconds.

In a still further embodiment the sample can include reference marks at predefined locations relative to the first region and the method can include further steps of providing an ion optical column having a deflection system for deflecting the ion beam in a direction perpendicular to a direction of ion beam propagation, scanning a second region of the sample including the reference marks but not including the first region by the ion beam, and detecting interaction products caused to leave the sample by the ion beam while scanning the second region. The method can further include steps of determining positions of the reference marks based on the detected interaction products, determining a position of the first region based on the positions of the reference marks, applying a voltage to the deflection system to deflect the ion beam to the first region, and thereafter performing a step of impinging the ion beam to the first region to process the sample at the first region. Based on the images including the reference marks a fine alignment step between the sample and the charged particle beam can be performed.

In a further embodiment the ion beam column can further include an objective lens, and the method can further include the steps of focusing the ion beam with the objective lens to generate a focused ion beam spot at a first distance from the objective lens, and positioning the sample relative to the ion beam so that the superconducting film has a second distance from the objective lens. The first distance can be larger than the second distance. The advantages achieved with the controlled defocus have already been described above.

Again, the first distance can be at least 10 µm larger than the second distance and/or the first distance can be at most 100 µm larger than the second distance. Especially the first distance can be between 10 µm and 100 µm larger than the second distance. Alternatively, the ion optical column can include a beam liming aperture, and the method can further include a step of adjusting the objective lens to project the beam limiting aperture onto the film.

In a still further embodiment the disclosure features a method of creating a plurality of Josephson junctions including the steps of providing a sample including a film of a superconducting material at least partially covered by an electrically conductive layer and including a plurality of first regions where the superconducting film is not covered by the electrically conductive layer, processing several first regions by impinging a charged particle beam to a selected number of first regions of the plurality of first regions, recording the charged particle dose impinged onto each of the processed first regions during the processing, and providing an output protocol including the ion dose impinged onto each of the processed first regions.

The output protocol can include for each processed first region information about parameters of the ion beam during processing of each individual first region. Especially the output protocol can include for each first region an information about the location of such first region on the sample together with a measuring value of the ion dose applied to each individual first region. Based on experience and the data in the output protocol each created Josephson junction can be classified and selected according to its respective classification.

For collecting data for the output protocol the method can further include the step of detecting interaction products caused to leave the sample surface while impinging the charged particle beam to each of the processed first regions, and determining the charged particle dose based on the number of detected interaction products. Based on a known ratio between the number of charged particles in the impinging charged particle beam and the number of detected interaction products the dose of charged particles impinging on each first region can be determined based on the number of interaction products detected while processing the sample in the first region.

In a further embodiment the method can include a further step of writing a reference mark onto a surface of the sample, recording images of the reference mark by scanning the reference mark with the charged particle beam, and adjusting charged particle optical components based on information deducted from the recorded images of the reference mark. In particular the charged particle optical components can include at least one of: a stigmator, a beam deflection system and an objective lens. And the method can include a step of adjusting at least one of the stigmator, the beam deflection system and the objective lens based on data deducted from one or more images of the reference mark.

Further features and advantages of embodiments are disclosed in the following description of the drawings.

DETAILED DESCRIPTION

Figure 1:
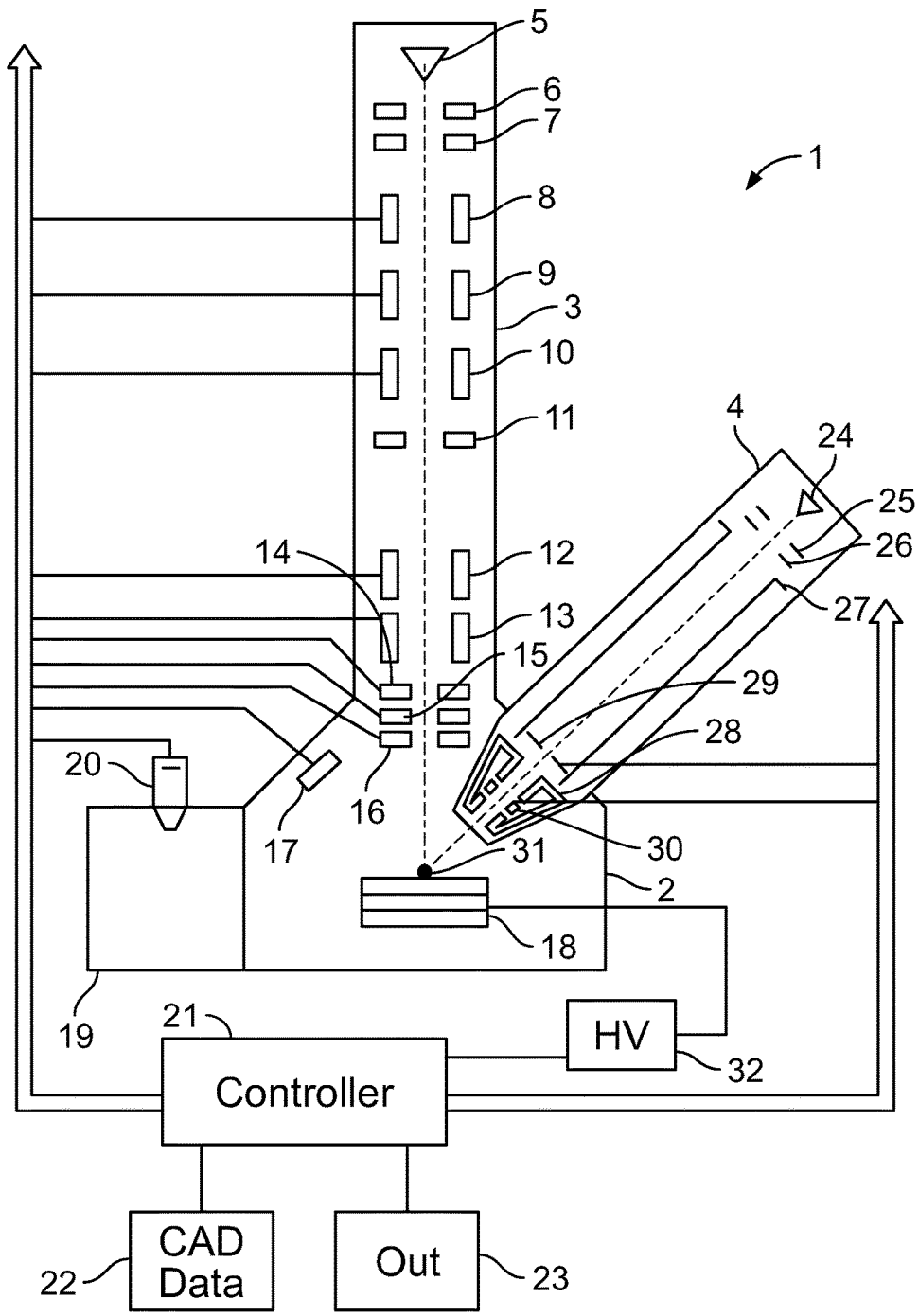
FIG. 1 is a schematic diagram of a charged particle beam system.

FIG. 1 shows a charged particle beam system 1 which includes a vacuum sample chamber 2, a first charged particle beam column 3 and a second charged particle beam column 4. The first charged particle beam column 3 is an ion beam column for providing an ion beam as a first charged particle beam. The first charged particle beam column 3 can be a gas field ion beam column, in particular a gas field helium ion beam column or a gas field neon ion beam column.

The ion beam column 3 includes an ion source 5, an extraction electrode 6 and an acceleration electrode 7. The ion source 5 includes a tip with a tip apex. By biasing extraction electrode 6 with a high voltage compared to the ion source 5 gas atoms of an operation gas supplied to the ion source are ionized in the neighborhood of the tip apex to provide a beam of positively ionized gas atoms. In an embodiment the gas in a gas field ion source includes a noble gas such as helium and the ions in the ion beam accordingly include positive noble gas ions.

By applying an additional high voltage between the acceleration electrode 7 and the ion source 5 the ion beam is accelerated to its column beam energy.

In the direction of beam propagation of the ion beam a double deflection system 8, 9 follows. This double deflection system with the deflection electrodes 8, 9 serves to adjust the center of the ion beam with respect to the optical axis of the objective lens at the terminating portion of the first charged particle beam column 3. In addition the first charged particle beam column includes a stigmator 10 in the form of two not-aligned quadrupole elements or an octupole element with which the stigmatic characteristics of the ion beam can be adjusted.

Following in the direction of beam propagation the first charged particle beam column 3 includes an aperture diaphragm 11, a further double deflection system 12, 13 and an objective lens including three electrodes 14, 15 and 16. The deflection system in the neighborhood of the objective lens with the deflections electrodes 12 and 13, herein also called the first deflection system, serves to deflect the ion beam in directions perpendicular to the optical axis of the objective lens 14, 15, 16. The objective lens with the three electrodes 14, 15 and 16 serves to focus the ion beam at a particular distance from the final electrode 16 of the objective lens in the direction of beam propagation.

Within the sample chamber 2 a sample stage 18 is mounted in a manner that a sample positioned on the top surface of the sample stage 18 can be moved in three independent linear directions (two directions perpendicular to the optical axis of the objective lens and one direction along or coaxial to the direction of the optical axis of the objective lens) as well as tilted and rotated (the tilt axis is oriented perpendicularly to the optical axis of the objective lens and the rotation axis is oriented parallel or coaxial to the optical axis of the objective lens).

In addition, a detector 17 is arranged within the sample chamber 2. The detector 17 is configured and designed to detect interaction products which are caused to leave a sample surface due to an irradiation of the sample surface with the ion beam.

The second charged particle beam column 4 is in the form of an electron beam column. This second charged particle beam column 4 includes an electron source 24 which emits electrons, several electrodes 25, 26 to extract electrons out of the electrons source 24 and an anode 27 to adjust the current of the electron beam. By applying a high voltage between the electron source 24 and the anode 27 electrons extracted from the electron source 24 are accelerated to their column energy.

Following downwards in the direction of beam propagation of the electron beam the second charged particle beam column 4 includes an objective lens 28 with which the electron beam is focused to a small spot downwardly of the objective lens 28 in the direction of beam propagation of the electron beam. The objective lens 28, can be a magnetic lens with a magnetic pole piece having a gap. Within the gap of the pole piece a deflection system 30 is arranged by which the electron beam can be deflected in directions perpendicular to the optical axis of the objective lens 28 indicated by the dashed line. Furthermore, within the electron beam column a so called in-lens detector 29 is arranged by which interaction products which are caused to leave a sample due to irradiation with the electron beam can be detected.

Alternatively to a magnetic lens the objective lens 28 of the electron beam column can be an electrostatic lens.

The first charged particle beam column 3 and the second charged particle beam column 4 are arranged at a particular angle with respect to one another so that the optical axis of the first charged particle beam column and the second charged particle beam column intersect at a particular point 31, a coincidence point. The sample stage 18 can be positioned within the sample chamber 2, depending on the height of a sample mounted on the top surface of the sample stage 18, so that the coincidence point 31 is positioned on the surface of the sample mounted on the sample stage 18. In this manner any point on the top surface of a sample mounted on sample stage 18 can concurrently be investigated by two different charged particle beams, the ion beam and the electron beam. On the other hand it is also possible to concurrently investigate any point on the sample surface by irradiating the sample surface with the electron beam and detecting interaction products caused to leave the sample surface due to the impinging electron beam (secondary electrons or backscattered electrons) and concurrently to process the sample by the ion beam of the first charged particle beam column 3.

The sample stage 18 is mounted within the sample chamber 2 in an electrically isolated manner so that a high voltage can be applied to the sample stage 18 by a high voltage source 32. By applying a high voltage to the sample stage 18 and a sample to be mounted on the sample stage the landing energy of the charged particles when impinging onto a sample positioned on the sample stage 18 can be increased or decreased. In particular the sample stage 18 can be biased by an electrical potential which is negative compared to the electrical potential of the final lens electrode 16 of the ion beam column (first charged particle beam column 3) so that the landing energy of ions leaving the first charged particle beam column will be larger than the column energy of the ions within the first charged particle beam column 3.

The sample stage 18 includes position measurement systems (not shown) which are designed and configured so that linear movements of the sample stage 18 can be measured with an accuracy of 5 nm or even better. In particular the position measuring systems of the sample stage 18 can be interferometric measurement systems. A first and a second interferometric measurement systems are provided for measuring movements of the sample stage 18 in two directions perpendicular to the optical axis of the first charged particle beam column 3. A third interferometric measuring system is provided for measuring a movement of the top surface of sample stage 18 in the direction along or parallel to the optical axis of the first charged particle beam column 3.

Attached to the sample chamber 2 is a load-lock 19 which serves to transport a sample from outside the sample chamber 2 into the sample chamber 2. The load-lock 19 includes a camera 20 with which an optical image of the sample and its positioning relative to a sample holder can be recorded when the sample is positioned within the load-lock 19.

The charged particle beam system further includes a controller 21 which is configured to receive data from the camera 20 in the load-lock, the detector 17 in the sample chamber 2, the in-lens detector 29 within the second charged particle beam column 4 as well as from a data file 22. The controller 21 furthermore is configured to control the various components within the first charged particle beam column 3 and the second charged particle beam column 4. Ideally the controller 21 is configured to control the voltages applied to the electrodes 14, 15 and 16 of the objective lens of the first charged particle beam column 3, the electrodes 12 and 13 of the first double deflection system in the first charged particle beam column 3, the voltages applied to the electrodes of the stigmator 10 of the first charged particle beam column 3 as well as the control voltages applied to the electrodes 8, 9 of the second double deflection system within the first charged particle beam column 3. In addition the controller 21 is configured to control a voltage applied to the sample stages 18 to change the landing energy of the charged particles before impinging on the sample surface. Ideally the controller 21 is configured to apply a voltage to the sample stage 18 which is negative with respect to the voltage of the final electrode 16 of the first charged particle beam column 3 so that ions leaving the first charged particle column 3 are accelerated between the last electrode 16 of the objective lens of the first charged particle beam column and the sample surface. The controller 21 is furthermore configured to control a bias voltage of the sample stage via a computer-controllable high voltage source 32.

In addition the controller 21 is configured to receive design data 22 of a sample to be processed. Furthermore, the controller 21, is configured to generate a data file 23 based on recordings during processing of a sample.

In the following the operation of the charged particle beam system will be described with reference to FIGS. 5, 6 and 7.

When a sample is loaded into the load-lock 19 in a first step 70 an image of the sample surface is recorded with camera 20 in a second step 71. The data recorded by camera 20 are fed to controller 21 and compared in a step 72 by controller 21 with the design data 22 of the sample loaded into the load-lock 19.

Figure 5:
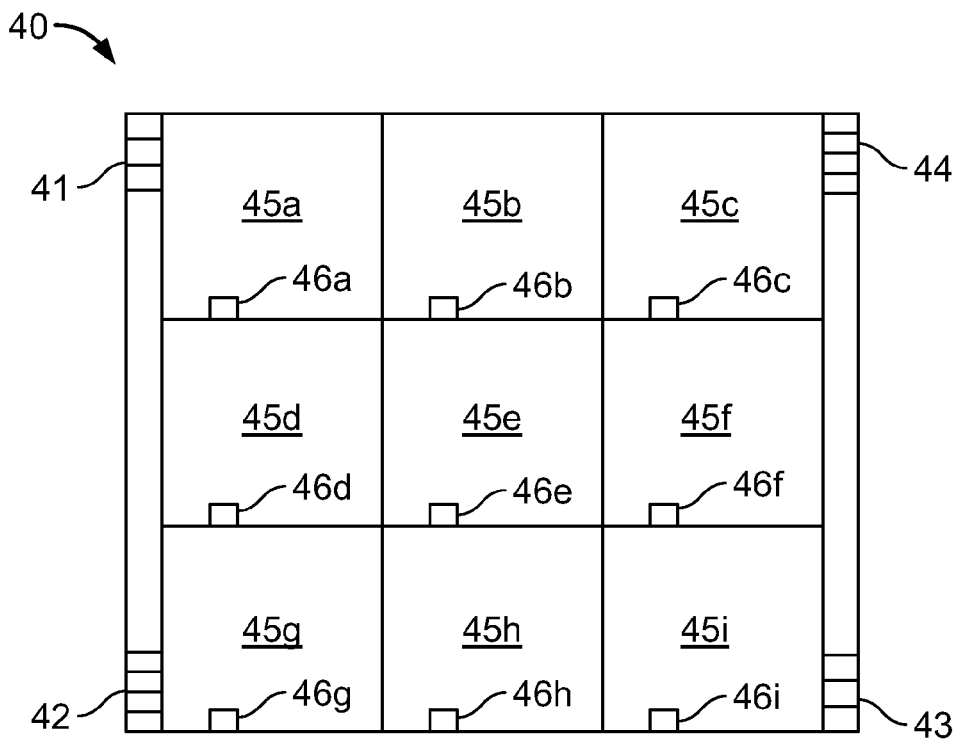
FIG. 5 is a top view of a sample surface including several chip regions.

A top view onto an exemplary sample 40 is shown in FIG. 5. The sample 40 includes at least one, but often very many more, chip regions 45a to 45i of which nine chip regions are shown in FIG. 5. It should also be noted that other numbers of chip regions of a sample are possible and that the number of chip regions can be smaller than nine, i.e. between one and eight, or even much larger than nine.

At a border region the sample 40 includes rough alignment marks 41 to 44 which are configured in a manner and with respect to their dimensions so that these rough alignment marks 41 to 44 can be identified in an image recorded by camera 20 and the position of the alignment marks can be determined in the recorded image. Each chip region 45a to 45i also includes a fine alignment mark 46a to 46i the dimensions of which however are so small so that these fine alignments marks cannot be identified in an image recorded with camera 20 on load-lock 19.

The controller 21 is configured to compare the image recorded by camera 20 with the CAD design data 22 of the sample and to compare the position of each of the rough alignment marks 41 to 44 in the recorded image with the position of the corresponding rough alignment mark 41 to 44 in the sample design data. In a step 74 the controller determines regions with respect to the rough alignment marks 41 to 44 in which in each chip region the position of the respective fine alignment mark 46a to 46i has to be expected.

In the next step the sample is transported from the load-lock 19 into the sample chamber 2. Thereafter a fine alignment step 73 is carried out either with the aid of the ion beam or the electron beam. If this fine alignment step 73 is carried out with the ion beam the first deflector 12, 13 of the ion beam column is used to scan small regions around the positions where the fine alignment marks 46a to 46i are to be expected within each chip region 45a to 45i. During this scanning interaction products which are caused to leave the sample surface due to the impinging ions, especially secondary electrons, are detected by chamber detector 17 and the detection signals are recorded by controller 21 in dependence of the position where the ion beam impinges on the sample surface.

As an alternative to the ion beam the electron beam of the second charged particle beam column 4 can also be used for this fine alignment step 73. In this case the electron beam is scanned within the regions where the fine alignment marks 46a to 46i are to be expected and including the fine alignment marks. Interaction products caused to leave the sample surface due to the impinging electrons are detected by in-lens detector 29 of the electron beam column, and the detection signals are recorded by controller 21 in dependence of the position where the electron beam impinges on the sample surface.

With the system shown in FIG. 1 the operator can select in advanced whether the electron beam or the ion beam is to be used for recording these images.

Figure 6:
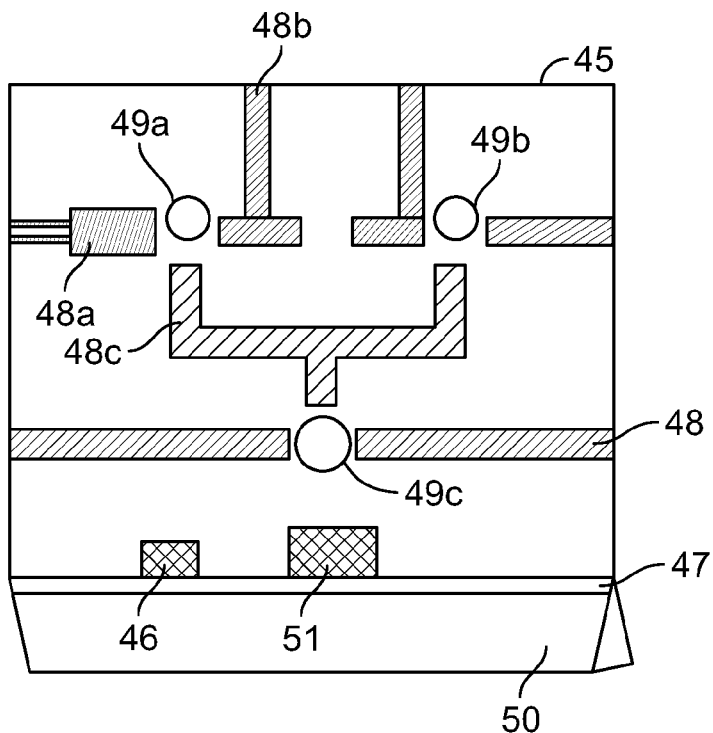
FIG. 6 is an enlarged top view of an excerpt of the sample surface in FIG. 5.

Elements of FIG. 6 show a portion of a single chip region 45, whereby the sample includes a substrate 50 covered with a thin film 47 of high temperature superconducting material, for example YBCO or another suitable rare earth oxide material. Particular designs of proper samples are disclosed in the article by Shane Cybart et al. cited in the background portion. The disclosure of this article is fully incorporated herein by reference, especially with respect to the preparation of suitable samples.

The sample includes regions 48, 48a, 48b, 48c in which the film 47 of high temperature superconductive material is covered by electrically conductive layers 48, 48a, 48b, 48c, for example gold layers. These electrically conductive layers and layer portions later can form electrical terminals after fabrication of the devices has been completed.

Between individual electrically conductive structures 48a, 48b, 48c regions 49a, 49b, 49c are provided which are not covered by an electrically conductive layer. These regions 49a, 49b, 49c are the regions in which the Josephson junctions are to be created. Because the creation of Josephsons junctions by charged particle beam induced dislocations is very sensitive to the applied charged particle beam dose these regions 49a, 49b, 49c form forbidden zones onto which no charge particle beam should impinge during any alignment step. Any impingement of charged particles to one of these forbidden zones is to be restricted to the final processing step.

Based on the positions of the fine alignment marks 46 determined by scanning the regions around the fine alignments marks 46a-46i in step 73, either with the ion beam or the electron beam and comparing the measured positions of each of the fine alignment marks with the respective intended position according to the sample design data file 22 the controller determines the positions of each of the forbidden zones 49a-49c in a step 76.

It should be mentioned that in FIG. 6 only three forbidden zones are shown but that each chip region 45 can have a much larger number of forbidden zones 49 if more Josephson junctions are to be created.

In a next step 77 a sample height map is created either by using the ion beam or the electron beam.

For creating the height map by using the ion beam, locations on each chip region 45a to 45i outside the forbidden zones 49a, 49b, 49c are scanned with the ion beam and for each chip region an optimum focus setting is determined. This can be achieved with an autofocus mechanism, for example by scanning small regions on the sample surface with the ion beam with different focus settings of the objective lens (electrodes 14, 15, 16), determining the contrast or spatial frequencies within each image recorded by this scanning of small regions, and changing the focus setting of the objective lens iteratively until an optimum images contrast and/or an image showing the highest possible spatial frequencies is recorded. For each respectively scanned position the optimum focus setting is recorded by controller 21 and stored. These steps are repeated for a plurality of regions more or less equally distributed over the complete sample surface but always outside of any forbidden zone 49a-49c. After the height map has been created for a plurality of regions outside the forbidden zones 49a-49c controller 21 generates interpolated optimum focus settings for each of the forbidden zones 49a to 49c by interpolating optimum focus settings for regions in the neighborhood of each of the forbidden zones.

Instead of using the ion beam for creating the height map alternatively in step 77 the electron beam also can be used to create the height map. The procedure is identical to the procedure as just described with the only difference that the various sample regions outside the forbidden zones 49a to 49c are scanned with the electron beam of the second charged particle beam column 4 and the controller generates the height map or the map of optimum focus setting for each region on the sample surface outside the forbidden zones 49a to 49c by changing the strength of the objective lens 28 of the electron beam column. If the height map is recorded using the electron beam, however, a further transformation is used for transforming the height map recorded with the electron beam into a map for the ion beam if the later processing of the sample is to be performed by the ion beam.

With the system shown in FIG. 1 the operator can select in advance whether the electron beam or the ion beam is to be used for recording the height map.

After the fine alignment step 74 and the recording of the heights map in step 77 a further alignment step 75 is carried out. In this further alignment step 75 the ion beam of the first charged particle beam column 3 is deflected to impinge onto a sample region at defined positions relative to the fine alignment marks 46a-46i and outside of any of the forbidden zone 49a-49c. For this position an optimum focus setting according to the height map is adjusted and, thereafter, using the ion beam a very small reference mark, for example a cross as shown in region 51 in FIG. 6, is written into this region 51 in a step 75 by ion beam sputtering.

Alternatively in step 75 the small reference mark or fiducial can be created by gas assisted charged particle beam induced chemistry, such as gas assisted charged particle beam induced etching or charged particle beam induced deposition.

This reference mark (also herein referred to as system alignment mark) created in step 75 later can serve for auto-beam-alignment of the ion beam column and to compensate long term drifts which can become disturbing if a large sample with a very large number of Josephsons junctions has to be created and the processing time will become respectively long. During the later processing of the sample, from time to time in repeated steps 82 the region 51 including the reference mark can be scanned by the ion beam and an image of the reference mark can be recorded by detecting interaction products caused to leave the sample surface because of the impinging ions and forming an image of this region 51 with the aid of the recorded detection signals. The detailed process for auto alignment of the ion beam column and compensating long term drifts will be explained hereinafter below in more detail.

After the various alignment steps have been finalized the processing of the sample and the creation of the Josephson junctions in the various forbidden zones 49a to 49c can be started.

The various steps of the procedure are controlled by controller 21. The controller 21 is especially configured to identify the rough alignment marks in the image of the sample and the image of the sample holder and to calculate the positions of these rough alignment marks of the sample in the image. The controller 21 is further configured to compare the positions of these rough alignment marks with positions for these rough alignment marks provided by the CAD data 22 of the sample. The controller is configured to determine the positions of the fine alignment marks 46a to 46i in each of the sample regions 45a to 45i based on the comparison of the positions of the rough alignment marks 41 to 44 in the recorded image with the positions for these rough alignment marks according to the CAD data 22. The controller 21 is configured to control a fine alignment step which is carried out either with the first charged particle beam column 3 or the second charged particle beam column 4. If the first charged particle beam column 3 is used for this fine alignment step the controller controls the first deflection system with deflection electrodes 12, 13 to deflect the ion beam of the first charged particle beam column to a position in the vicinity of one of the alignment marks 46a in one of the sample fields 45a. The controller is configured to control the deflection system in a manner that a small region around this fine alignment mark 46a and including this fine alignment mark 46a is scanned by the ion beam and an image of this region is recorded by detecting interaction products caused to leave the sample due to the impinging ion beam by detector 17. The controller is further configured to control the first deflection system in a manner that this step of recording images of regions including the fine alignment marks is repeated for each of the sample regions 45b to 45i.

Instead of recording images of regions including the fine alignment marks 46a to 46i by the ion beam of the first charged particle beam column 3 the controller can control the recording of images of regions including the fine alignment marks 46a to 46i by using the electron beam of the second charged particle beam column 4. In the latter case the controller is configured to control the deflection system 30 of the electron beam to scan the desired regions including the fine alignment marks 46a to 46i one after the other. With the system shown in FIG. 1 the operator can select in advance whether the electron beam or the ion beam is to be used for recording these images.

In a second comparison step the controller 21 is configured to identify the positions of each of the fine alignment marks 46a to 46i in the recorded images and to compare these identified positions with positions of these fine alignment marks 46a to 46i according to the CAD data 22. The controller 21 is further configured to determine the positions of the forbidden zones 49a-49c within sample 45 based on such comparison. The controller 21 is further configured to control the recording of a height map of the sample. The recording of the height map either can be carried out by the first charged particle beam column 3 or the second charged particle beam column 4. If the first charged particle beam column providing the ion beam is used for recording the height map of the sample 45 the controller 21 controls the first deflection system of the first charged particle beam column 3 with the deflection electrodes 12, 13 to scan regions of the sample outside the forbidden zones 49a to 49c of each of the sample regions 45a to 45i. Concurrently with scanning the sample regions 45a to 45i interaction products caused to leave the sample due to the impinging ions are detected with detector 17 and the detection signal of detector 17 is read out by controller 21. For each scan position of the first deflection system of the first charged particle beam column 3 the controller 21 concurrently controls and changes the strength of the objective lens with the electrodes 14, 15, 16 until an image showing the strongest contrast is achieved. For each respective field region the voltages applied to the objective lens with the electrodes 14-16 of the ion beam column providing the optimum contrast are recorded and stored by controller 21. The stored lens excitations for each region on the sample 45 together with the coordinates of the respective sample region form the components of the height map. The controller 21 is further configured to perform an interpolation between values recorded in the neighborhood of each forbidden zone 49a-49c of the sample 45 to create interpolated height values or optimum adjustment values for the objective lens for each of the forbidden zones.

As described above, an alternative to recording the height map of the sample 45 by the ion beam the electron beam of the second charged particle beam column 4 can also be used to record the height map. In this latter case the controller 21 controls the deflector 31 of the second charged particle beam column 4 to scan different regions distributed over the complete surface of sample 40 outside of any forbidden zone 49a-49c and to detect interaction products caused to leave the sample 40 due to the impinging electron beam by in-lens detector 29. The controller 21 is furthermore configured to control the objective lens 28 of the second charge particle beam column 4 to change until for each region an image with optimum contrast is recorded. In this alternative case the lens excitation providing optimum contrast in the image together with the coordinates of the positions at which the respective images are recorded form the components of the height map. Again, with the system shown in FIG. 1 the operator can selected in advanced whether the height map is to be recorded with the electron beam or the ion beam. Accordingly, the controller 21 is configured such that the operator can select whether the height map is to be created by the aid of the electron beam or the ion beam.

Also in the case that the components of the height map are recorded by the electron beam the controller determines interpolated height values for each of the forbidden zones 49a-49c by interpolating height values in the neighborhood of each of the forbidden zones 49a-49c.

To the extent that the sample surface is too large to record the various images either during the fine alignment step or during the generation of the height map only by deflecting the ion beam or the electron beam the sample can be moved in the direction perpendicular to the optical axis of the first charged particle beam by moving the sample stage 18. The positioning of the sample stage 18 or the movements of the sample stage between the recordings of the various images is measured by an interferometric measuring system of the stage 18 and these movements are considered by controller 21 during generation of the height map and during determination of the positions of the forbidden zones 49a-49c of each of the sample regions 45a-45i.

In addition to the already described alignment steps, images of sample regions can be recorded either by using the ion beam or the electron beam as a primary charged particle beam and detection of interaction products caused to leave the sample due to the impinging charged particle beam at various tilt angles of the sample surface with respect to the optical axis of the charged particle beam column can be used to record such images. In order to change the respective tilt angle the sample stage can be rotated around an axis which is perpendicular to the optical axes of both charged particle beam column 3 and 4. By using appropriate and known software algorithms and using the height map already recorded a 3D model of the sample surface can be created by controller 21.

After the various alignment steps have been completed the controller 21 controls the processing of the sample 40 in a step 80. During this processing the controller 21 controls the excitation of the objective lens of the ion beam in a step 78 to provide an optimum focus setting for the forbidden zone 49a to be processed in this step. Concurrently the controller controls in a step 79 the first deflection system with the electrodes 12, 13 to deflect the ion beam to the position of the forbidden zone 49a to be processed in this processing step 80. Thereafter the ion beam is switched on and controlled to impinge onto the area 49a to be processed. While the ion beam impinges on the forbidden zone 49a to be processed interaction products caused to leave the sample surface due to the impinging ions are detected by detector 17. Based on the detector signal the controller 21 determines the dose of ions which impinge onto the area to be processed during a predetermined dwell time. Based on the output signal of the detector 17 integrated over the complete time during which the ion beam impinges onto each one of the forbidden zones 49a (dwell time) the controller 21 determines the ion dose impinged onto this area 49a and stores the respective values together with the information about the position of the respective processed area in an output data file 23. As described above, in a alternative embodiment the dose of charged particles impinging on the area 49a to be processed can be determined by measuring the current in the charged particle beam in a preceding current measuring step and by multiplying the measured current with the applied dwell time and dividing this product by the spot area of the charged particle beam on the surface of the sample during this processing. If this method to determine the ion dose is applied by the controller 21 the respective values estimated or calculated in this manner together with the information about the position of the respective processed area are stored in the output data file 23.

Figure 11:
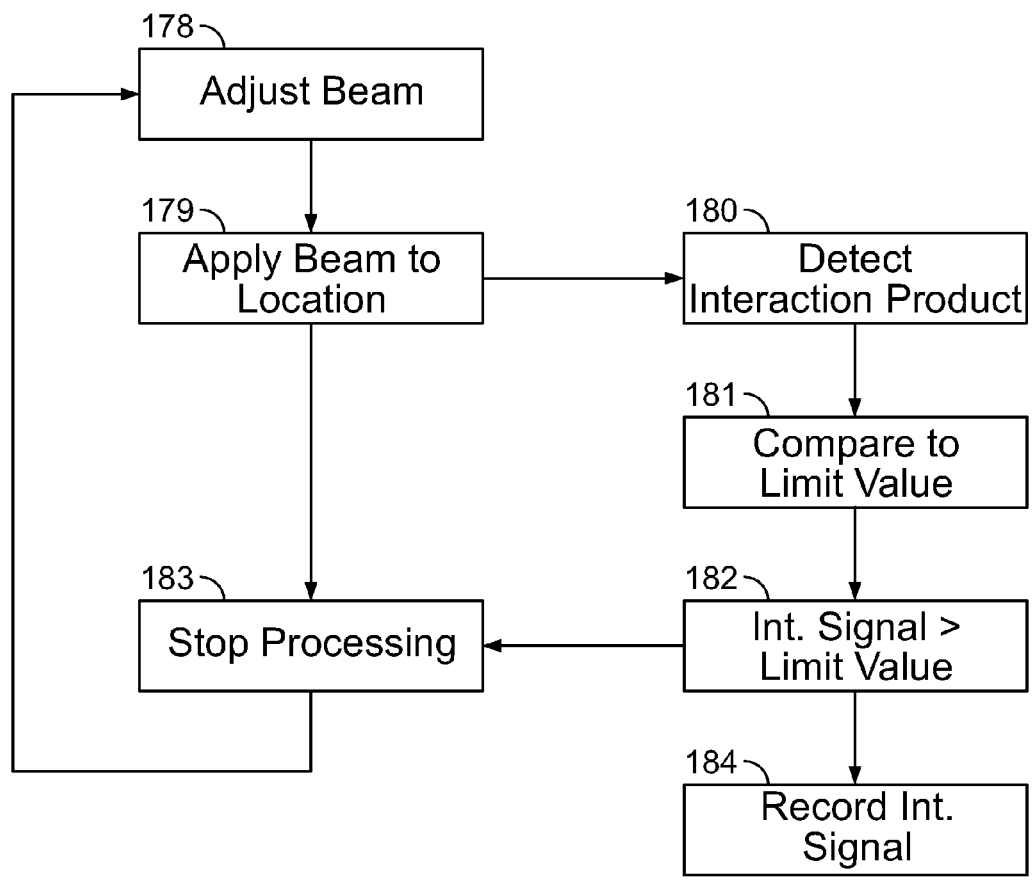
FIG. 11 is a diagram illustrating the processing of the sample within a particular dwell time.

As shown in FIG. 11, after adjusting the charged particle beam with respect to focus and charged particle current while impinging onto the sample surface outside any area to be processed (forbidden zone) the charged particle beam is deflected to impinge onto this forbidden zone and applied to this forbidden zone in a step 179. While the charged particle beam impinges onto the forbidden zone the particles leaving the surface of the sample are detected in a step 180, integrated over the time while the charged particle beam impinges onto this zone and the integrated value is compared to a predetermined limit value in a step 181. When the integrated value in a step 182 exceeds the predetermined limit value the processing is stopped in a step 183 by deflecting the charged particle beam to a region outside any forbidden zone. The integrated value at the time of stopping the processing is recorded in a step 184. The time lapsed between starting the processing in step 179 and stopping the processing in step 183 defines the dwell time.

The process as described above with reference to FIG. 11 is controlled by the controller 21. In this manner the controller controls the dose of charged particles impinged onto each forbidden zone by controlling the dwell time.

During the processing of each individual forbidden zone the charged particle beam is adjusted to have a maximum beam diameter of 500 pm to 1000 pm within the film of the sample 40. The positional accuracy of the charged particle beam during processing is better than 10 nm and ideally within the range 1 nm-10 nm. Each forbidden zone is processed with a charged particle dose in the range between $10^{14}$-$10^{18}$ charged particles per $cm^2$ for a dwell time in the range between 100 ns and 1 ms.

In the same manner as just described above all forbidden zones 49a to 49c are processed one after the other. For each forbidden zone the excitation of the objective lens (voltages applied to the electrodes 14, 15, 16 of the objective lens) of the ion beam column 3 is adjusted based on the data in the height map in a manner that for each forbidden zone the desired focus setting including a desired controlled defocus is achieved. For this dynamic focusing (dynamic focusing because the focus setting can change between the processing of one forbidden zone and the processing of the next forbidden zone) the controller 21 is configured to determine the position of the forbidden zone to be processed next, to read the corresponding focus setting for this position based on the height map, to calculate a desired excitation of the objective lens based on the height map under considering a desired controlled defocus and to adjust the excitation of the objective lens according to the calculated desired excitation.

To the extent that the number of the forbidden zones 49a to 49c becomes very large and, accordingly the processing time also becomes very large the controller from time to time controls the deflection system so that the ion beam impinges onto the area 51 including the system alignment mark created in step 75. By recording images of this system alignment mark in a step 83 at various excitations of electrodes 14 to 16 of the objective lens any long term drifts of the complete system can be determined by controller 21 and the respective results of this realignment or recalibration step 82 are used by controller 21 for determining the optimum positions and adjustments during the processing of forbidden zones 49b and 49c which have to be processed thereafter. For achieving the optimum realignment of the ion beam the controller also is configured to analyze the image of the system alignment mark, to evaluate proper settings for the objective lens (electrodes 14-16), the stigmator 10 and the second deflection system 8,9 and to change the excitation of the objective lens, the second deflection system and the stigmator 10 to the evaluated proper setting of the respective component, respectively. This re-registering step 82 will be repeated from time to time and as often as desired to ensure that each forbidden zone is processed with a charged particle beam having the desired beam characteristics at the surface of the sample to be processed.

Figure 7:
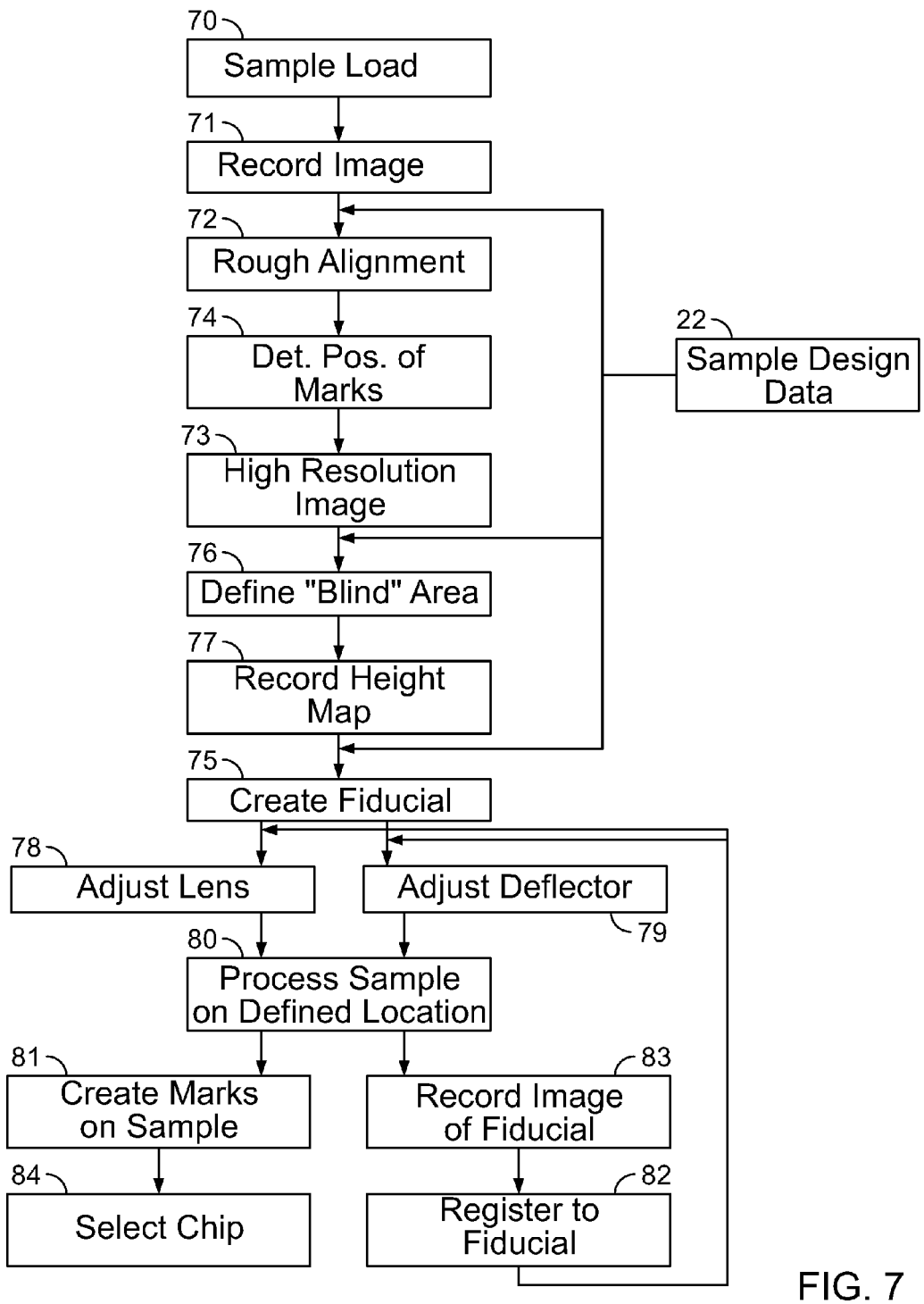
FIG. 7 is a diagram of the process steps of an embodiment.
Figure 14:
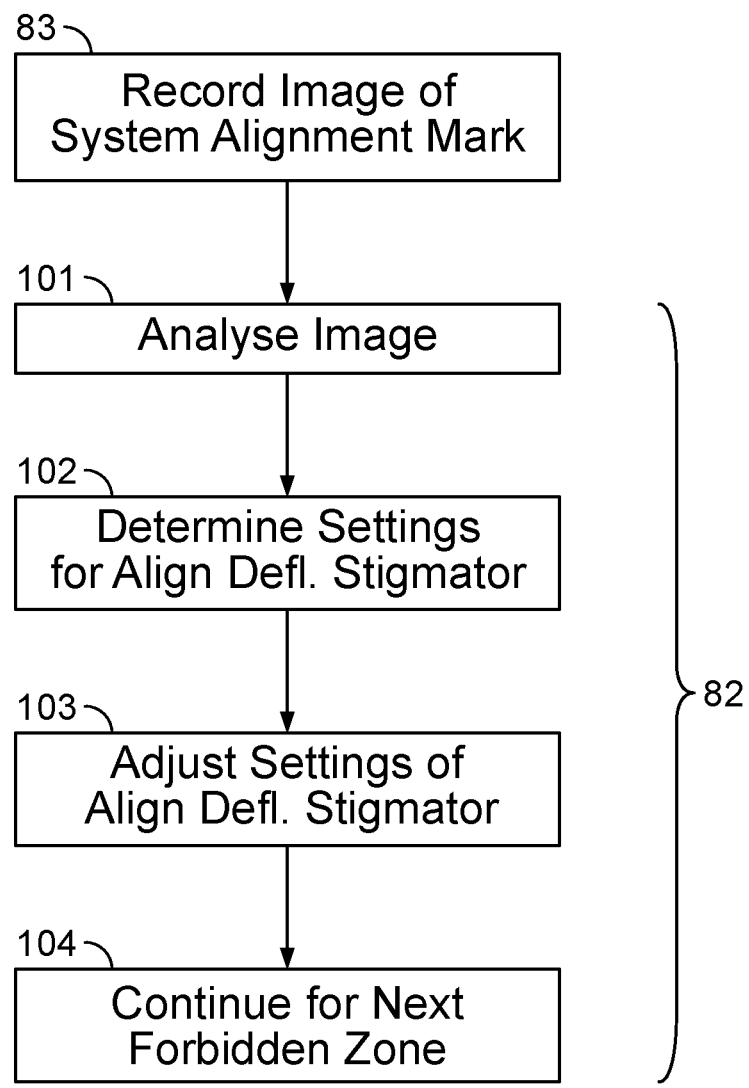
FIG. 14 is a diagram of process steps carried out during a realignment of the charged particle beam column during processing of large samples.

The process of the realignment of the ion beam column depicted in FIG. 7 with a single step 82 "Register to Fiducials" is shown in more detail in FIG. 14. As explained above, in a step 83 from time to time an image of the system alignment mark is recorded by using the ion beam. In most instances a series of images of the system alignment mark with different settings of the objective lens of the ion beam column 3 is recorded. In a consecutive step 101 the controller 21 conducts an image analysis of the recorded image or series of images of the system alignment mark. Based on this image analysis optimized settings for the alignment deflector (second deflection system with electrodes 8,9 in FIG. 1) the stigmator and the objective lens are determined in a step 102. Thereafter the controller 21 controls in a step 103 an adjustment of the settings of the alignment deflector and the stigmator to the optimized settings determined in the preceding step 102. Thereafter the process is continued in a step 104 for the next forbidden zone. As explained above with reference to FIG. 7 based on the coordinates of the forbidden zone to be processed next the corresponding data of the height map are read by controller 21. Based on the respective data in the height map and the optimized objective setting determined in step 103 a corrected optimized objective setting is determined for the zone to be processed next. The objective lens is adjusted to this corrected optimized objective setting, the ion beam is deflected to the coordinate of the forbidden zone to be processed next and this forbidden zone is processed by applying the desired ion dose to this forbidden zone. These steps are repeated for a number of forbidden zones to be processed. After a predefined number of forbidden zones have been processed the process goes back to step 83 and records one or a series of images of the system alignment mark to carry out the realignment of the ion beam column anew. As explained above, the complete process of realignment of the ion beam column is controlled by controller 21 and, accordingly, controller 21 is configured to control the various steps of the realignment procedure.

After a complete sample region 45a-45i has been processed as described above in a step 81 a mark is created in a defined region of the sample region, the mark including a code by the aid of which for each processed forbidden zone the dose of charged particles impinged to this forbidden zone can be determined later on. Based on a reading of this mark or the data in the output data file 23 later in a step 84 a chip can be selected which is assumed to be suited for the desired intention to be performed with this chip.

Figure 3:
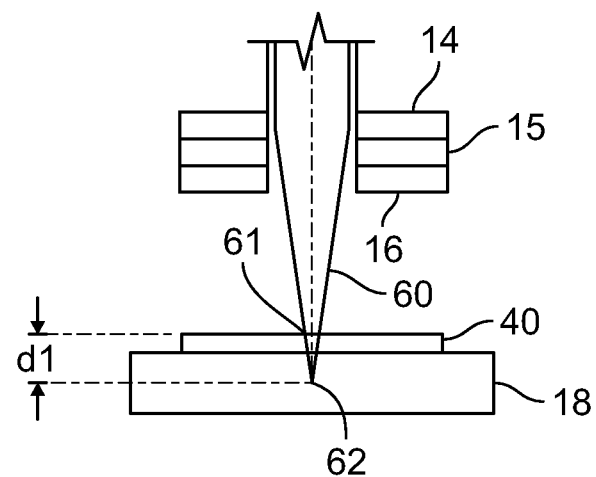
FIG. 3 is a diagram showing a defocused charged particle beam.

FIG. 3 explains the concept of a controlled defocus of the charged particle beam during processing of the sample 40. Shown in FIG. 3 is the lower portion of the first charged particle beam column between the objective lens with the electrodes 14, 15 and 16 and the sample stage 18. During normal operation and especially when an image of the sample is recorded the charged particle beam is controlled by the objective lens (by applying respective voltages to electrodes 14, 15 and 16) to impinge focused onto the surface of a sample 40 positioned on sample stage 18, i.e. the focus of the charged particle beam 60 coincides with the top surface of sample 40. This kind of operation provides the highest resolution when recording an image of the top surface of sample 40. However during processing of the sample 40 in the forbidden zones 49 a-49 c different voltages are applied to the electrodes 14, 15 and 16 in a manner that the focus of the charged particle beam 60 appears upstream or downstream of the surface of sample 40.

The working distance, i.e. the distance between the final electrode 16 of the objective lens and the surface of sample 40 in cases in which the charged particle beam is focused on the top surface of sample 40 defines a first distance. In the case of a controlled defocus the distance between the final electrode 16 and the focus 62 of the charged particle beam defines a second distance. The second distance is a distance d1 larger or smaller than the first distance. The difference d1 between the first distance and the second distance typically is in the range between 10 µm and 100 µm. As explained above the controlled defocus provides a steeper increase and decrease of the intensity profile of the charged particle beam 60.

Figure 8:
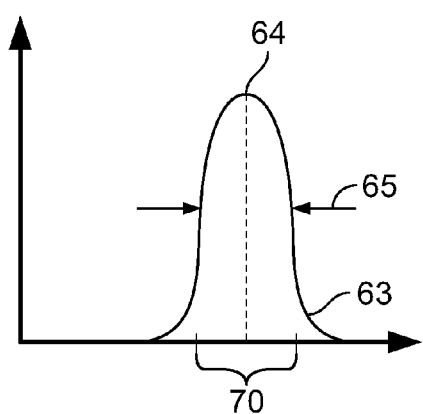
FIG. 8 is a diagram of an intensity profile of a charged particle beam in a first mode of operation.

FIG. 8 shows the intensity profile 63 at the surface of the sample 40 in a first mode in which the charged particle beam 60 (FIG. 3) is focused onto the top surface of sample 40. The intensity profile describes the number of impinging charged particles per area unit and per time. The intensity profile in this case is similar to a Gaussian distribution with a maximum value 64 and a broadness 65.

Figure 9:
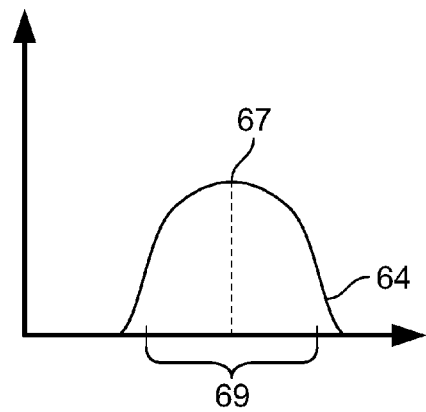
FIG. 9 is a diagram of an intensity profile of a charged particle beam in a second mode of operation.

FIG. 9 shows the intensity profile 64 at the top surface of the sample 40 in a second mode in which the charged particle beam 60 is focused a distance d1 below the top surface of sample 40. The intensity profile 64 is broader at the top surface of sample 40 than in the first mode and the maximum intensity 67 is smaller than the maximum value 64 in the first mode. Nevertheless the intensity within the area 69 is more homogeneous in the second mode than in the area 70 in the first mode. Thus the creation of beam induced dislocations becomes more homogeneously distributed in the second mode than in the first mode.

Figure 4:
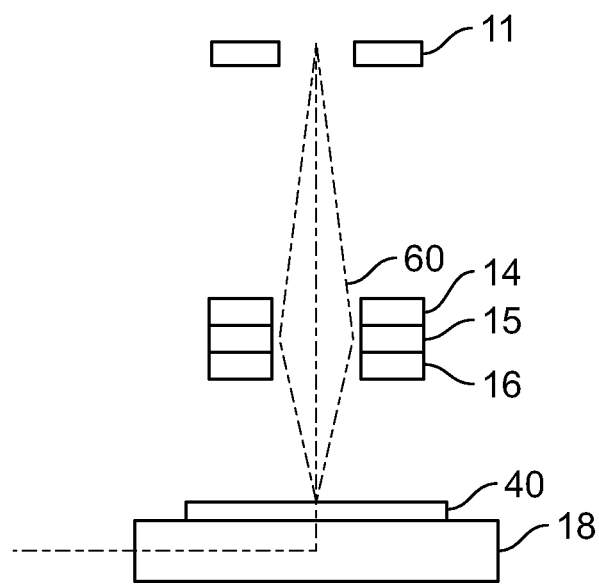
FIG. 4 is a schematic diagram showing the projection of an aperture diaphragm onto an object plane.
Figure 10:
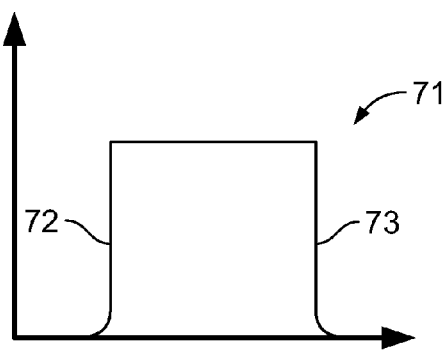
FIG. 10 is a diagram of an intensity profile of a charged particle beam in a second mode of operation in a second embodiment.

FIG. 4 show another mode of controlled defocused operation in which the electrodes 14, 15 and 16 are biased with voltages in a manner that the aperture diaphragm 11 of the charged particle beam column is projected onto the top surface of sample 40. In this mode of operation the intensity profile becomes a top-hat profile type 71 as shown in FIG. 10 with nearly infinite slopes of the intensity profile at the borders 72, 73 of the charged particle beam. If this third mode of operation is used for processing the sample 40 the distribution of charged particle beam induced dislocations becomes even more homogeneous than in the second mode as described above.

Figure 2:
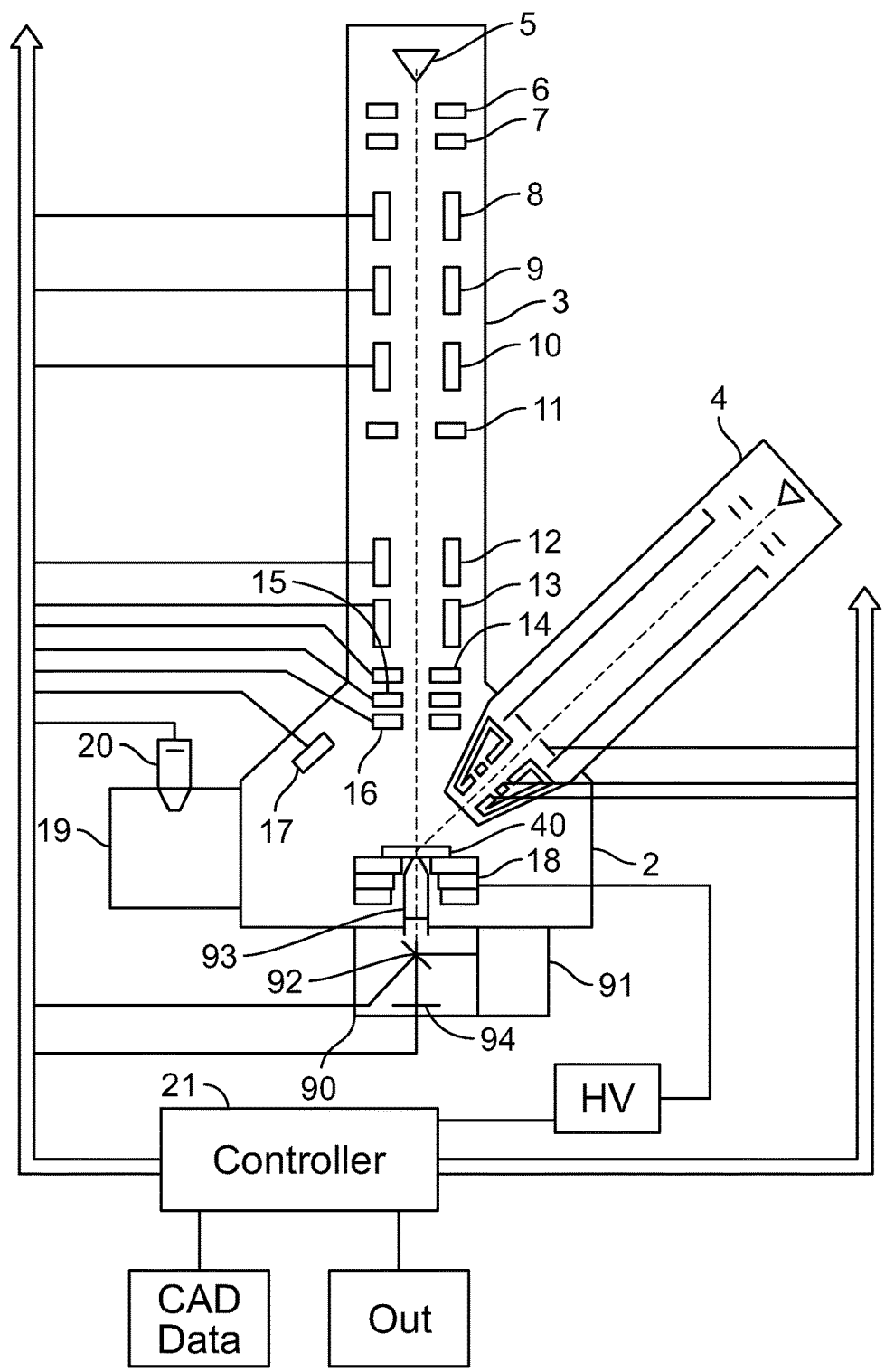
FIG. 2 is a schematic diagram of another embodiment of a charged particle beam system.

FIG. 2 shows a second embodiment of a charged particle beam system. Also this second embodiment includes a first charged particle beam column 3 and a second charged particle beam column 4 attached to a sample chamber 2 as described above with reference to FIG. 1. The first charged particle beam column 3 and the second charged particle beam column 4 can be designed in a similar manner as described above with reference to FIG. 1.

In addition to the two charged particle beam columns 3, 4 the system includes a scanning light microscope 90 with a laser 91 as a light source, one or more scan mirrors 92, an objective lens 93 and a light detector 94. The complete light microscope is attached to the sample chamber 2 coaxially to the optical axis of the first charged particle beam column 3 but on an opposing side so that the charged particle beam of the first charged particle column impinges onto a top surface of a sample 40 attached to sample stage 18 while the light beam of the scanning light microscope impinges onto a bottom surface (opposing the top surface) of the sample 40.

By recording an image of the sample 40 from below by scanning light microscope 90 an image of the structure on the top surface of sample 40 can be recorded by scanning the sample with a focused laser beam. This light optical image can be used in an additional alignment step between the coarse alignment step and the fine alignment step or for identifying the positions of the fine alignment marks 46a-46i in step 74. With the use of the optical image recorded by scanning light microscope 90 the risk of scanning a forbidden zone with the charged particle beam either during the fine alignment step or during the creation of the height map can be further reduced.

Figure 12:
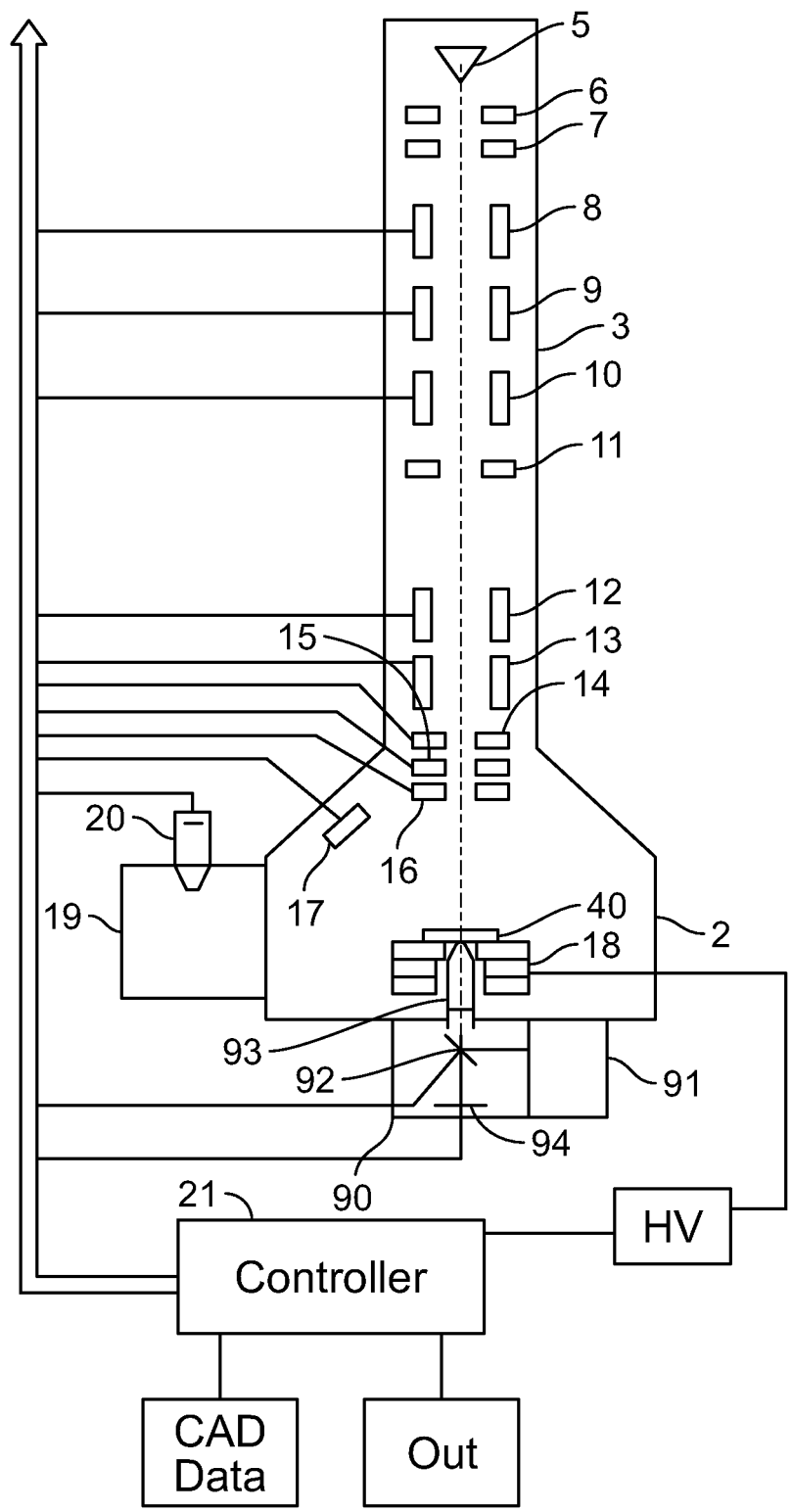
FIG. 12 is a schematic diagram of another embodiment of a charged particle beam system.

A further embodiment is shown in FIG. 12. This system only includes a single charged particle beam column and a scanning light microscope 90. The single charged particle beam column 3 can have a similar design as the first charged particle beam column 3 described above with reference to FIG. 1. The scanning light microscope can have a similar design as just described with reference to FIG. 2. As described above with reference to FIG. 2, the complete scanning light microscope is attached to the sample chamber 2 coaxially to the optical axis of the first charged particle beam column 3 but on an opposing side so that the charged particle beam of the first charged particle column impinges onto a top surface of a sample 40 attached to sample stage 18, while the light beam of the scanning light microscope impinges onto a bottom surface (opposing the top surface) of the sample 40. The process carried out with the system shown in FIG. 12 can be just the same as described above with the only differences that the fine alignment step as well as the creation of the height map is to be carried out with an ion beam impinging onto the sample surface and scanning regions around the fine alignment marks 46a-46i in step 73.

Figure 13:
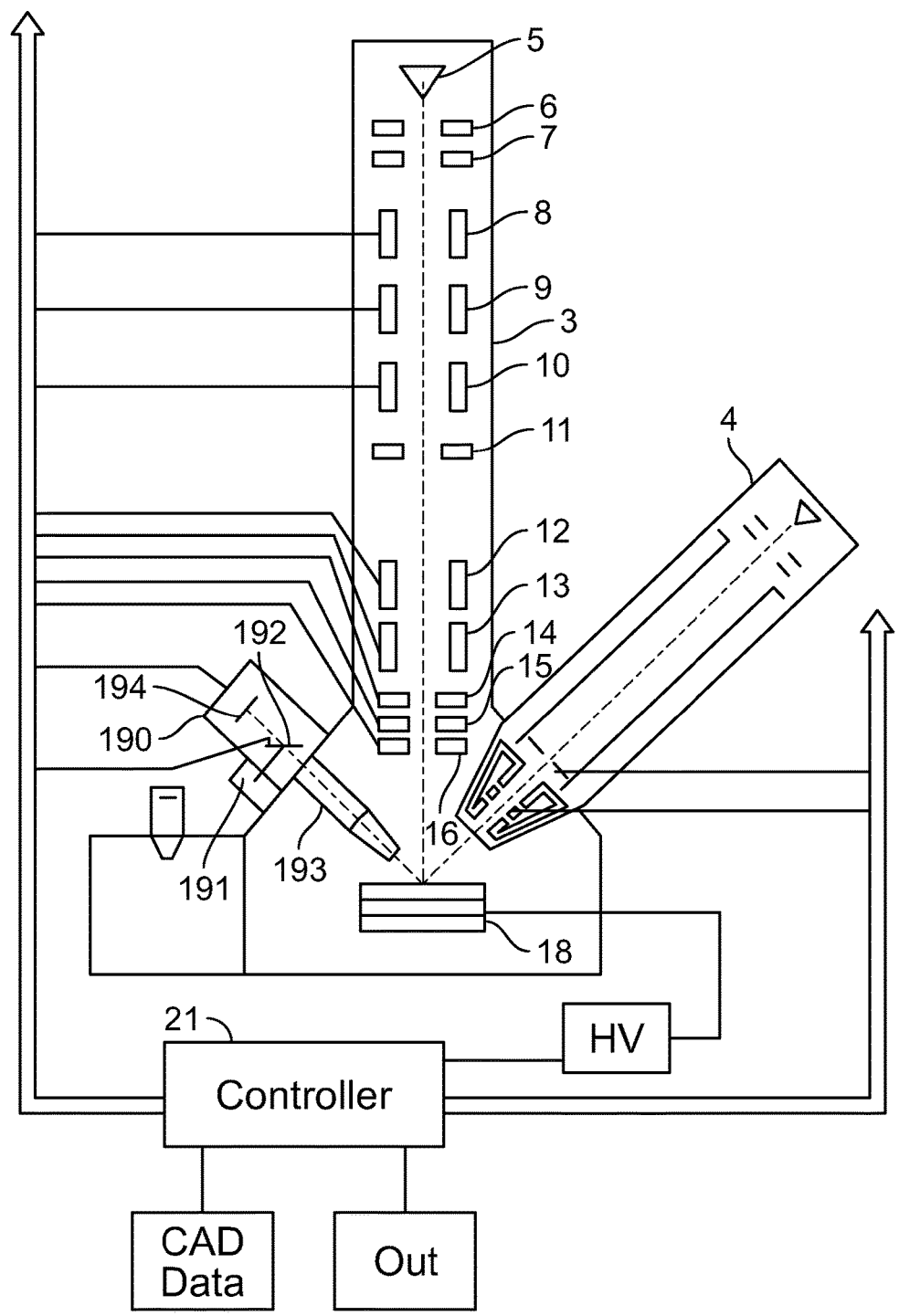
FIG. 13 is a schematic diagram of a still further embodiment of a charged particle beam system.

FIG. 13 shows a further embodiment of an ion beam system combined with an optical microscope. The components of the first charged particle beam columns 3 (ion beam column) and of the second charged particle beam column 4 (electron beam column) are identical to the system as described with reference to FIG. 2. The major difference between the system shown in FIG. 2 and the system shown in FIG. 13 is that the optical microscope 190 with the laser light source 191, the scan mirror 192, microscope objective lens 193 and detector 194 are arranged so that the light beam impinges onto the sample from the same side as the charged particle beams of the first charged particle beam column 3 and the second charged particle beam column 4 impinge onto a sample positioned on sample stage 18. In this embodiment the light beam of the optical microscope does not need to travel through the substrate of the sample before reaching the layers of the sample with the structures and the reference marks.

Similarly as with the embodiment shown in FIG. 2, by recording an image of the sample positioned on sample stage 18 by scanning light microscope 190 an image of the structure on the top surface of sample can be recorded by scanning the sample with a focused laser beam. This light optical image can be used in an additional alignment step between the coarse alignment step and the fine alignment step or for identifying the positions of the fine alignment marks 46a-46i in step 74. Also with this embodiment, with the use of the optical image recorded by scanning light microscope 190 the risk of scanning a forbidden zone with the charged particle beam either during the fine alignment step or during the creation of the height map can be further reduced.

When processing the forbidden zones by using a gas field ion beam ion beam currents in the range between 10 pico ampere and 100 pico ampere can be applied. Appropriate dwell times during which the ion beam impinges onto a particular forbidden zone can be in the range between 100 nano seconds and 1 milli seconds, depending on the adjusted ion beam current.

A bias voltage applied to the sample stage and the sample can be positive or negative with respect to the voltage of the last electrode of the objective lens of the charged particle beam column used during processing of the sample. In the case that positively charged ions are used for processing the sample a negative voltage can be preferred to increase the landing energy of the ions when impinging onto the surface of the sample. This provides the possibility to process thicker samples, i.e. samples with a thicker film of high temperature superconducting material. However, in particular cases and for particular high temperature superconducting materials it can be desirable to reduce the landing energy of the ions when impinging onto the surface of the sample to avoid unintended damage to the sample. In such cases a positive voltage compared to the voltage of the last electrode of the objective lens can be applied to the sample to reduce the landing energy of the sample.

In particular embodiments the system can also include a flood-gun, i.e. a further electron beam column emitting an unfocused electron beam of low energy electrons. The flood gun can be used to avoid any sample charging during processing of the sample. However a flood gun only shall be used while processing a sample including a high temperature superconducting material which is insensitive or not very sensitive to low energy electrons, or in cases in which the forbidden zones are protected by a protective layer, to avoid any undesired or uncontrolled creation of dislocations in forbidden zones by the low energy electrons of the flood gun.

What is claimed is:

1. A charged particle beam system, comprising:
    a charged particle beam column, comprising:
        a charged particle source configured to provide a charged particle beam;
        an objective lens; and
        a first deflection system configured to change a position of impingement of the charged particle beam in a sample plane,
    a sample chamber comprising a sample stage configured to hold a sample to be processed; and
    a controller configured to: a) control the charged particle beam to create a height map of a sample surface based on information collected using the charged particle beam column; b) store the height map; and c) dynamically adjust the objective lens based on a position of impingement of the charged particle beam according to the height map, wherein the charged particle beam system comprises a gas field ion source that produces a gas field ion beam and is configured to create Josephson junctions in a high temperature superconducting material using ions emitted by the gas field ion source.

2. The charged particle beam system of claim 1, wherein the controller is further configured to: d) receive design data of the sample surface; and e) control the first deflection system based on a combination of the design data with data recorded during or after loading the sample to the sample chamber.

3. The charged particle beam system of claim 1, wherein the charged particle beam column is an ion beam column, and the charged particle beam system further comprises an electron optical column comprising an electron source configured to provide an electron beam.

4. The charged particle beam system of claim 3, wherein the controller is configured to adjust the position of impingement of the charged particle beam in dependence on positions identified in an image recorded with the electron beam or the ion beam.

5. The charged particle beam system of claim 1, wherein the sample stage is configured to move a sample positioned on the sample stage in at least three linear independent directions, the sample stage comprises a measuring system configured to measure movement of the sample stage with a measuring accuracy of five nanometers or less.

6. The charged particle beam system of claim 5, wherein the measuring system comprises interferometric measuring systems.

7. The charged particle beam system of claim 1, further comprising an optical image recording system configured to record an image of the sample surface, wherein the controller is configured to receive an image recorded with the optical image recording system.

8. The charged particle beam system of claim 1, further comprising a stigmator, wherein the controller is configured to adjust the stigmator based on an image recorded by scanning a portion of the sample surface with the charged particle beam and detection of interaction products caused to leave the sample surface while scanning.

9. The charged particle beam system of claim 1, further comprising a second deflection system, wherein the controller is further configured to adjust the second deflection system based on an image recorded by scanning a portion of the sample surface with the charged particle beam and detection of interaction products caused to leave the sample surface while scanning.

10. The charged particle beam system of claim 1, wherein the controller is configured to control a dose of ions of the gas field ion beam impinging on the sample region to be processed either based on interaction products leaving the sample during processing of the sample region or by measuring a beam current of the charged particle beam.

11. The charged particle beam system of claim 2, wherein the design data of the sample surface comprises CAD data.

12. The charged particle beam system of claim 1, wherein, to collect the information to create the height map of the sample surface, the controller is configured to:
    instruct the charged particle beam column to scan a plurality of regions of the sample surface;
    for each scanned region: i) determine an optimum focus setting of the objective lens based on information collected using the charged particle beam column; and ii) record the optimum focus setting of the objective lens.

13. A charged particle beam system comprising:
    a charged particle beam column, comprising:
        a charged particle source configured to provide a charged particle beam;
        an objective lens;
        a stigmator; and
        a first deflection system configured to change a position of impingement of the charged particle beam in a sample plane;
    a sample chamber comprising a sample stage configured to hold a sample to be processed;
    a detector configured to detect interaction products caused to leave the sample during impingement of the charged particle beam onto the sample surface; and
    a controller configured to:
        a) use the charged particle beam column to create a reference mark in the sample surface; and
        b) adjust the stigmator based on an image recorded by scanning a portion of the sample surface with the charged particle beam and detecting interaction products caused to leave the sample surface while scanning, the portion of the sample surface scanned with the charged particle beam comprising the reference mark, wherein the charged particle beam system comprises a gas field ion source configured to produce a gas field ion beam and is configured to create Josephson junctions in a high temperature superconducting material using ions emitted by the gas field ion source.

14. The charged particle system of claim 13, wherein the controller is configured to adjust the charged particle beam column based on the detected interaction products to compensate for drift in the charged particle system.

15. A charged particle beam system comprising:
a charged particle beam column, comprising:
  a gas field ion source configured to provide an ion beam;
  an objective lens; and
  a first deflection system configured to change a position of impingement of the ion beam in a sample plane;
a sample chamber comprising a sample stage configured to hold a sample to be processed;
a detector configured to detect interaction products caused to leave the sample during impingement of the ion beam onto the sample surface; and
a controller configured to: a); generate image data based on output signals of the detector; b) control a dose of ions in the ion beam impinging on a sample region to be processed based on interaction products leaving the sample during processing of the sample region, and c) stop processing of the sample region when the dose of ions exceeds a predetermined limit value wherein the charged particle beam system is configured to create Josephson junctions in a high temperature superconducting material.

16. A method, comprising:
a. generating an image of a surface a sample in a sample chamber using a light optical imaging system or an electron beam system;
b. identifying reference marks in the image;
c. determining positions of the reference marks on the surface of the sample based on the identified reference marks;
d. determining a location of a first region of the surface of the sample to be processed based on the positions of the reference marks and design data of the sample;
e. biasing a deflection system of a charged particle beam system according to the location determined in d, the charged particle beam system being selected from the group consisting of the electron beam system and an ion beam system;
f. scanning a charged particle beam generated by the charged particle beam system over the first region of the surface of the sample and simultaneously detecting products of the interaction of the charged particle beam with the sample to determine and record a location of an alignment mark in the surface of the sample, the alignment mark being different from the reference marks, and
g. creating a Josephson junction in a high temperature superconducting material by directing ions from a gas field ion beam onto the first region.

17. The method of claim 16, further comprising recording a height map of the sample surface.

18. The method of claim 17, wherein the height map is recorded by using an electron beam or the gas field ion beam.

19. The method of claim 18, further comprising adjusting a focus position of the gas field ion beam in step g based on the height map.

20. The method of claim 16 further comprising:
measuring a number of interaction products of the gas field ion beam with the sample while the gas field ion beam impinges on the first region; and
dynamically adjusting a dwell time during which the gas field ion beam impinges on the first region either based on the measured number of interaction products by comparing the measured number of interaction products with a predefined number of interaction products or by measuring the beam current of the gas field ion beam.

21. The method of claim 16, wherein the charged particle beam system further comprises an objective lens by which the gas field ion beam is focused onto the first region, and the method further comprises:
focusing the gas field ion beam with the objective lens to generate a focused ion beam spot at a first distance from the objective lens; and
positioning the sample in step g) relative to the gas field ion beam so that the surface of the sample has a second distance from the objective lens, the first distance being different from the second distance.

22. The method of claim 21, wherein the first distance is at least one micrometer different from the second distance.

* * * * *

UNITED STATES PATENT AND TRADEMARK OFFICE
CERTIFICATE OF CORRECTION

PATENT NO. : 10,410,828 B2
APPLICATION NO. : 14/976162
DATED : September 10, 2019
INVENTOR(S) : Chuong Huynh et al.

It is certified that error appears in the above-identified patent and that said Letters Patent is hereby corrected as shown below:

In the Claims

Column 23, Line 25, Claim 15, delete "a);" and insert -- a) --.

Signed and Sealed this
Twelfth Day of May, 2020

Andrei Iancu
*Director of the United States Patent and Trademark Office*